United States Patent [19]

Takizawa et al.

[11] 4,365,278
[45] Dec. 21, 1982

[54] DEVICE FOR DETECTING NON-RECORDED PORTIONS ON MAGNETIC TAPE

[75] Inventors: Yoshiyuki Takizawa; Takashi Kashiwazaki; Koji Shimoda; Kazumi Kuriyama, all of Tokorozawa, Japan

[73] Assignee: Pioneer Electronic Corporation, Tokyo, Japan

[21] Appl. No.: 182,744

[22] Filed: Aug. 29, 1980

[30] Foreign Application Priority Data

Aug. 31, 1979 [JP] Japan ................. 54/111863

[51] Int. Cl.³ ............... G11B 15/18; G11B 17/00
[52] U.S. Cl. ......................... 360/73; 360/72.1; 360/74.4
[58] Field of Search ............. 360/73, 72.1–72.2, 360/74.4

[56] References Cited

U.S. PATENT DOCUMENTS

| Re. 30,416 | 10/1980 | Yasunaga | 360/72.1 |
| 3,893,177 | 7/1975 | Takenaka | 360/72.1 |
| 4,115,821 | 9/1978 | Okada | 360/72.1 |
| 4,198,664 | 4/1980 | Yasunaga et al. | 360/73 |
| 4,288,823 | 9/1981 | Yamamoto et al. | 360/73 |
| 4,290,090 | 9/1981 | Yamamoto et al. | 360/74.4 |

Primary Examiner—John H. Wolff
Attorney, Agent, or Firm—Sughrue, Mion, Zinn, Macpeak and Seas

[57] ABSTRACT

A device for detecting non-recorded portions on a magnetic tape including a circuit for preventing malfunctions in the detecting device. The output from a playback head of a tape recorder is amplified then passed through a malfunction preventing circuit which passes the signal if its amplitude is above a preset level for at least a predetermined period of time. The output signal from the malfunction preventing circuit is waveform shaped then rectified and passed through a charge/discharge circuit to a solenoid energizing circuit. The malfunction preventing circuit includes a variable impedance element such as a field effect transistor coupled between an output terminal of the circuit and ground with the impedance of the element varied in accordance with the magnitude of the input signal with a delay added. The waveform shaping circuit, the rectifying circuit and the charge/discharge circuit convert the output of the malfunction preventing circuit into a switching waveform used to control a solenoid which sets the tape speed of the tape recorder such that the tape is run fast when no signal is present on the tape.

10 Claims, 7 Drawing Figures

DEVICE FOR DETECTING NON-RECORDED PORTIONS ON MAGNETIC TAPE

BACKGROUND OF THE INVENTION

The invention relates to a device for detecting non-recorded portions on a magnetic tape for use with a tape recorder or the like. More particularly, the invention relates to a circuit for preventing malfunctions for use in such a detecting device.

Conventional detecting devices of this general type operate in such a way that a signal recorded on the magnetic tape is reproduced by a reproduction magnetic head and the output signal from the magnetic head is amplified and then rectified and amplified again. A switching circuit is provided which is set to either the ON or OFF state depending on the output of the rectifying circuit. Non-recorded portions on the magnetic tape are indicated by the state of the output of the switching circuit. However, with the use of such a detecting device, detection of non-recorded portions on a magnetic tape is sometimes erroneously indicated in the case where a magnetic tape is recorded with only a small level differential between the recorded portions and the non-recorded portions of the magnetic tape. An example of such a magnetic tape is a micro-cassette tape which has an inherently small S/N ratio.

SUMMARY OF THE INVENTION

Accordingly, it is an object of the invention to provide a malfunction preventing device for use with a detecting device for detecting non-recorded portions on a magnetic tape in which the aforementioned drawback is eliminated.

The invention provides a device for detecting non-recorded portions on a magnetic tape and for operating in response thereto a solenoid for controlling the running speed of the tape including an amplifying circuit for amplifying an output signal from a playback head in a tape recorder, a malfunction preventing circuit having an input coupled to an output of the amplifying circuit. The malfunction preventing circuit passes the output signal from the amplifying circuit to an output terminal of the malfunction preventing circuit when the output signal has an amplitude level above a predetermined level for at least a predetermined period of time. Means is provided for operating the solenoid in response to the output signal produced on the output terminal of the malfunction preventing circuit. Preferably, the operating means includes a waveform shaping circuit, a rectifying circuit, and a charge/discharge circuit coupled in that order from the output terminal of the malfunction preventing circuit. The operating means energizes the solenoid when the level of the signal on the output terminal of the malfunction preventing circuit is above a predetermined level and deenergizes the solenoid when the signal on the output terminal of the malfunction preventing circuit is below the predetermined level. Also preferably, the malfunction preventing circuit is constructed of a variable impedance device coupled between the output terminal of the malfunction preventing circuit and ground and means for controlling the variable impedance means in response to the amplitude of an input signal to the malfunction preventing circuit after a delay is imparted thereto.

DESCRIPTION OF THE PREFERRED EMBODIMENTS

A first preferred embodiment of the invention will be described with reference to the accompanying drawings.

Figure 1:
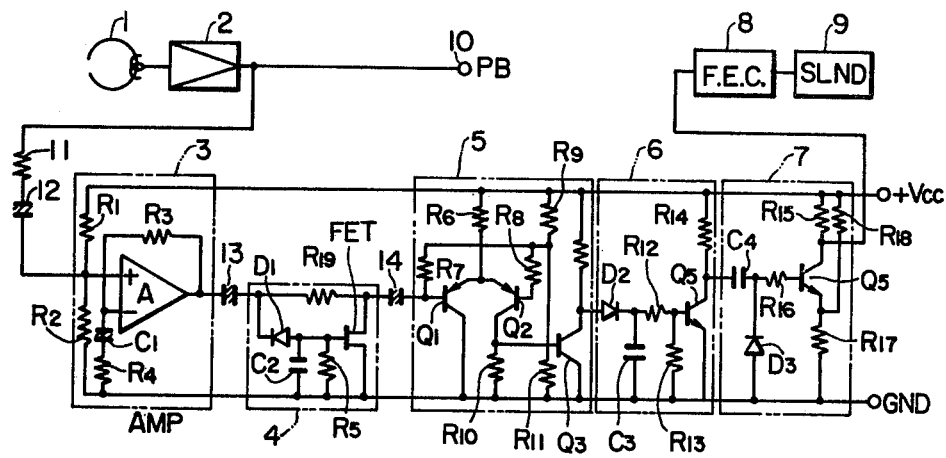
FIG. 1 is a circuit diagram showing a detecting device for detecting non-recorded portions on a magnetic tape constructed in accordance with the invention.

Referring to FIG. 1, an amplifying circuit 3, a waveform shaping circuit 5, a rectifying circuit 6 and a charge/discharge circuit 7 are connected between a power supply terminal $+V_{cc}$ and a ground terminal GND. The amplifying circuit 3 includes an operational amplifier A, resistors $R_1$ and $R_2$ used for voltage division, a feedback resistor $R_3$, a capacitor $C_1$ and a resistor $R_4$. The output of an equalizer amplifier 2 is fed through an adjusting resistor 11 and a coupling capacitor 12 to the non-inverting input terminal of the operational amplifier A.

A malfunction preventing circuit 4, which is an essential part of the invention, includes a resistor $R_{19}$, a diode $D_1$, a capacitor $C_2$, a resistor $R_5$ and a field effect transistor (FET). The input of the malfunction preventing circuit 4 is coupled via a coupling capacitor 13 to the output of the amplifying circuit 3 while the output of the circuit 4 is connected to the input of the waveform shaping circuit 5 via a coupling capacitor 14. A reversely-connected diode $D_1$ and a holding capacitor $C_2$ are connected in series between the input side terminal of the resistor $R_{19}$ and the ground terminal GND. A resistor $R_5$ is connected in parallel with the capacitor $C_2$ and the gate of the FET is connected to the resistor $R_5$. The source and drain of the FET are connected between the output side terminal of the resistor $R_{19}$ and the ground terminal GND.

The waveform shaping circuit 5 includes a pair of transistors $Q_1$ and $Q_2$ constituting a differential amplifier and a switching transistor $Q_3$ having a base connected to the collector of the transistor $Q_2$. Resistor elements $R_6$ through $R_{11}$ are further included in the circuit 5. The rectifying circuit 6 includes a rectifying diode $D_2$, a smoothing capacitor $C_3$, a transistor $Q_4$ and resistor elements $R_{12}$, $R_{13}$ and $R_{14}$. The charge/discharge circuit 7 includes a capacitor $C_4$, a switching transistor $Q_5$, a discharging diode $D_3$, and resistor elements $R_{15}$ through $R_{18}$. The collector of the transistor $Q_5$ is connected to a solenoid energizing circuit 8. In response to the output of the charge/discharge circuit 7, the solenoid energizing circuit 8 is actuated and produces a tape run control signal. A solenoid 9 connected to the output of the solenoid energizing circuit 8 is energized in response to the tape run control signal provided by the circuit 8 causing a tape to be run in a play mode.

In operation, the tape is run in the fast forwarding or rewinding mode and a signal recorded on the magnetic tape is reproduced by a reproduction head 1. The thus reproduced signal is delivered to a reproduction output terminal 10 through the equalizer amplifier 2 and is also amplified by the amplifying circuit 3. The gain of the amplifying circuit 3 is preset so that when a noise signal is present on a portion of the magnetic tape where no recorded sound is present, the output of the next stage, the malfunction preventing circuit 4, will be zero.

Figure 2A:
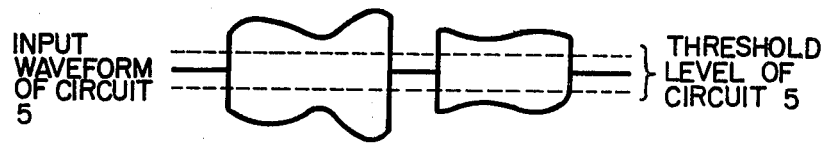
FIGS. 2A and 2B are waveform diagrams for a description of the circuit operation according to the present invention.

More specifically, the FET in the malfunction preventing circuit 4 is biased by the combination of the reversely-connected diode $D_1$, the capacitor $C_2$ which is used as a time delaying element, and a resistor $R_5$. The impedance of the malfunction preventing circuit 4 varies in accordance with the level of the reproduced signal. If no signal is recorded on the magnetic tape and thus the reproduced signal does not contain any recorded sound, the output of the malfunction preventing circuit 4 will be zero even if a noise signal is present so long as the level of the noise component is less than a predetermined value. Furthermore, if a pulsating noise signal whose instantaneous level is larger than the predetermined level is detected from the non-recorded portions of the tape, the zero output condition of the circuit 4 is maintained due to the time delay effect of the capacitor $C_2$. Accordingly, the output of the malfunction preventing circuit 4 is as shown in FIG. 2A. It can be appreciated from FIG. 2A that input signals whose level is greater than the predetermined level pass through the malfunction preventing circuit 4 whereas input signals whose level is less than the predetermined level are outputted as a zero level signal from the malfunction preventing circuit 4.

Figure 2B:

The output of the malfunction preventing circuit 4 is delivered to the waveform shaping circuit 5 where the signal shown in FIG. 2A is subjected to waveform shaping with respect to a predetermined threshold level. Thereafter, the output of the waveform shaping circuit 5 is applied to the rectifying circuit 6 where it is rectified. The transistor $Q_4$ is rendered ON when a signal carrying recorded sound is applied to the rectifying circuit 6. As a result, a low level output is supplied from the rectifying circuit as shown in FIG. 2B. On the other hand, the transistor $Q_4$ is rendered OFF when a signal not carrying recorded sound is applied to the rectifying circuit 6 as a result of which a high level output is supplied therefrom. The capacitor $C_4$ of the charge/discharge circuit 7 is grounded when the applied signal has a low level. Therefore, the base of the transistor $Q_5$ is at a zero potential and the transistor $Q_5$ is rendered OFF. Thus, the output of the charge/discharge circuit 7 is at a high level and, as a result, neither the solenoid energizing circuit 8 not the solenoid 9 is actuated. In this manner, while a signal carrying recorded sound is detected from the tape, the tape is run fast in a fast forwarding or rewinding mode. On the other hand, when the applied signal to the charge/discharge circuit 7 is at a high level, the transistor $Q_5$ is switched to the ON state since the capacitor $C_4$ is charged. The output of the charge/discharge circuit 7 then is at a low level and thus the solenoid energizing circuit 8 is actuated. As a result, the solenoid 9 is energized in response to the tape run control signal delivered from the solenoid energizing circuit 8. In response to the energization of the solenoid 9, the tape is run in the play mode.

Figure 3A:
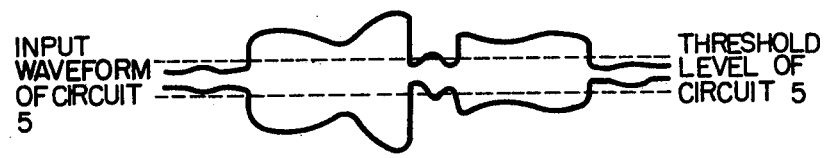
FIGS. 3A and 3B are waveform diagrams for a description of a conventional circuit.
Figure 3B:

Shown in FIGS. 3A and 3B are, respectively, a diagram showing the input waveform to the waveform shaping circuit 5 and a diagram showing the output waveform from the rectifying circuit 6 if the malfunction preventing circuit 4 were not provided.

As described above, with the use of the malfunction preventing circuit of the invention, a low level signal detected from a non-recorded portion on a tape is suppressed to a zero level after passing through the malfunction preventing circuit. A short duration pulsating noise signal from a non-recorded portion on the tape is absorbed by a capacitor in the malfunction preventing circuit due to its time delaying effect so that malfunction caused by such a noise signal is prevented and thus accurate detection of the non-recorded portion of the tape is provided. Further, use of the present invention is particularly advantageous for a micro-cassette tape recorder whose S/N ratio is small or for a music tape in which the recorded level is low.

Figure 4A:
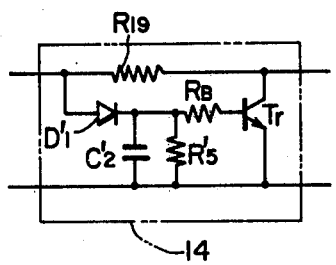
FIGS. 4A and 4B are circuit diagrams showing modifications of portions of the circuit of FIG. 1 in accordance with the present invention.
Figure 4B:
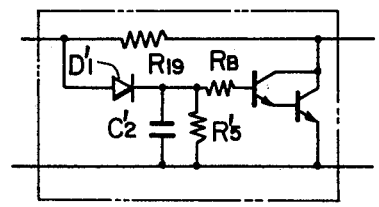

Although the present invention has been described with respect to a specific embodiment, it will be appreciated by one skilled in the art that a variety of changes or modifications may be made without departing from the essential scope of the invention. For example, by providing a voltage controlled variable attenuator in the malfunction preventing circuit to widen the dynamic range of the signal therein, more accurate results will be achieved. Furthermore, it is possible to employ a bipolar transistor Tr in place of the FET in the malfunction preventing circuit 4 as shown in FIG. 4A. In this embodiment, the malfunction preventing circuit 14 includes a diode $D_1'$ connected in the forward direction, a capacitor $C_2'$, a protecting resistor $R_B$, a resistor $R_5'$ and the transistor Tr. The impedance of the circuit 14 varies in accordance with the level of the input signal. Here, the threshold voltage is determined by the voltage across the diode $D_1'$ and the voltage developed across the base and emitter of the transistor Tr. The circuit 14 will operate properly with the amplifying circuit 3 accurately adjusted. Although the resistance of the protecting resistor $R_B$ is quite small, the voltage drop across the resistor $R_B$ may not be negligible. In such a situation, it is possible to force the voltage drop to be a negligible value with the use of Darlington-connected transistors as shown in FIG. 4B although the protecting resistor $R_B$ is still needed.

What is claimed is:

1. A device for detecting non-recorded portions on a magnetic tape and for operating a solenoid for controlling the running speed of the tape comprising: an amplifying circuit for amplifying a signal from a playback head in a tape recorder, said signal from said playback head having different amplitudes for recorded and non-recorded portions on said magnetic tape; a malfunction preventing circuit having an input coupled to an output of said amplifying circuit, said malfunction preventing circuit passing an output signal from said amplifying circuit to an output terminal of said malfunction preventing circuit when said output signal has an amplitude level above a predetermined level for at a predetermined period of time, and said malfunction preventing circuit comprising means for varying an impedance between said output terminal and a reference terminal in response to the amplitude of said output signal; and means for operating said solenoid in response to a signal produced on said output terminal of said malfunction preventing circuit.

2. The device of claim 1 wherein said operating means comprises a waveform shaping circuit having an input coupled to said output terminal of said malfunction preventing circuit, a rectifying circuit having an input coupled to an output of said waveform shaping circuit; a charge/discharge circuit having an input coupled to an output of said rectifying circuit; and a solenoid energizing circuit having an input coupled to an output of said charge/discharge circuit.

3. The device of claim 1 wherein said operating means energizes said solenoid when the level of the signal on said output terminal of said malfunction preventing circuit is above a predetermined level and deenergizes said solenoid when said signal on said output terminal of said malfunction preventing circuit is below said predetermined level.

4. The device of claim 1 wherein said variable impedance means provides a lower impedance between said output terminal and said reference terminal for lower levels of said amplitude of said output signal than for higher levels of said amplitude of said output signal.

5. The device of claim 1 wherein said malfunction preventing circuit comprises a field effect transistor having a source and drain coupled between said output terminal and a ground; a resistor coupled between an input terminal of said malfunction preventing circuit and said output terminal; a diode reversely connected between said input terminal and a gate of said field effect transistor; and a diode and resistor coupled in parallel between said gate of said field effect transistor and ground.

6. The device of claim 1 wherein said malfunction preventing circuit comprises a bipolar transistor having a collector coupled to said output terminal and an emitter coupled to ground; a first resistor coupled between an input terminal of said malfunction preventing circuit and said output terminal; a second resistor having a first terminal coupled to a base of said transistor; a diode having an anode coupled to said input terminal and a cathode coupled to a second terminal of said second diode; and a capacitor and a third resistor coupled between said second terminal of said second resistor and ground.

7. The device of claim 1 wherein said malfunciton preventing circuit comprises a first transistor having a collector coupled to said output terminal and an emitter coupled to ground; a second transistor having a collector coupled to said output terminal and an emitter coupled to a base of said first transistor; a first resistor coupled between said output terminal and an input terminal of said malfunction preventing circuit; a second resistor having a first terminal coupled to a base of said second transistor; a diode having an anode coupled to said input terminal; and a capacitor and a third resistor coupled between said second terminal of said second resistor and ground.

8. The device of any one of claims 2 to 7 wherein said waveform shaping circuit comprises a differential amplifier having an input coupled to said output terminal of said malfunction preventing circuit and an output transistor coupled to an output of said differential amplifier.

9. The device of any one of claims 2 to 7 wherein said rectifying circuit comprises a diode having an anode terminal coupled to an output of said waveform shaping circuit; a capacitor coupled between a cathode of said diode and ground; a transistor having an emitter coupled to ground and a collector coupled through a first resistor to a positive voltage source; a second resistor coupled between said cathode of said diode and a base of said transistor; and a third resistor coupled between said base of said transistor and ground.

10. The device of any one of claims 2 to 7 wherein said charge/discharge circuit comprises a capacitor having a first terminal coupled to an output of said rectifying circuit; a diode having a cathode coupled to a second terminal of said capacitor and an anode terminal coupled to ground; a transistor having an emitter coupled to ground through a first resistor and to a positive voltage source through a second resistor, a collector coupled to said positive voltage source through a third resistor and a base coupled to said cathode of said diode through a fourth resistor.

* * * * *